(12) United States Patent
Uematsu

(10) Patent No.: US 7,559,350 B2
(45) Date of Patent: Jul. 14, 2009

(54) APPARATUS AND METHOD FOR APPLYING A MATERIAL TO AN OBJECT

(75) Inventor: Yoshitaka Uematsu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 654 days.

(21) Appl. No.: 11/047,740

(22) Filed: Feb. 2, 2005

(65) Prior Publication Data

US 2005/0191413 A1      Sep. 1, 2005

(30) Foreign Application Priority Data

Feb. 3, 2004      (JP)      ............................. 2004-026978

(51) Int. Cl.
*B32B 37/00*      (2006.01)
*B32B 39/00*      (2006.01)
*B32B 43/00*      (2006.01)
(52) U.S. Cl. .................... 156/382; 156/578; 118/50
(58) Field of Classification Search ................ 156/381, 156/382, 578; 118/50, 50.1, 664, 671
See application file for complete search history.

(56) References Cited

U.S. PATENT DOCUMENTS 3,245,194 A * 4/1966 Carski .................... 53/432

2004/0134619 A1 * 7/2004 Kojima ..................... 156/356

FOREIGN PATENT DOCUMENTS

| JP | 10-241858 | 9/1998 |
|---|---|---|
| JP | 2002-216958 | 8/2002 |
| JP | 2003-017259 | 1/2003 |

OTHER PUBLICATIONS

Machine English Translation of JP 10-241858.*

* cited by examiner

*Primary Examiner*—Philip C Tucker
*Assistant Examiner*—Sing P Chan
(74) *Attorney, Agent, or Firm*—Finnegan, Henderson, Farabow, Garrett & Dunner, L.L.P.

(57) ABSTRACT

An apparatus to apply a material to an object. An ambience of a first chamber can be kept in inert gas. An ambience of a second chamber can be replaced between inert gas and air. A connecting channel connects between the first and second chambers. A first openable and closable door is provided between the first and second chambers. A second first openable and closable door is provided on the second chamber. A first holder in the first chamber can detachably hold an applicator. A second holder in the second chamber can detachably hold the applicator. A moveable table in the second chamber moves the applicator which is filled with the material and held by the second holder from the second chamber to the first chamber through the connecting channel. The moveable table moves the applicator which ends the application of the material from the first chamber to the second chamber through the connecting channel.

13 Claims, 10 Drawing Sheets

APPARATUS AND METHOD FOR APPLYING A MATERIAL TO AN OBJECT

CROSS REFERENCE TO RELATED APPLICATION

This application is based upon and claims the benefit of priority from the prior Japanese Patent Application No. 2004-26978 filed on Feb. 3, 2004; the entire contents of which are incorporated herein by reference.

BACKGROUND

1. Technical Field

The present invention relates to an apparatus for applying a material to an object, a method of applying a material to an object and a display manufacturing apparatus, in particular, to an apparatus to apply a material such as a sealant to an object, a method of applying a material such as a sealant to an object and a display manufacturing device for manufacturing a display such as an electro luminescent display.

2. Description of the Related Art

A display having a light emitting element such as an organic electro luminescent (EL) device has been developed as a new display, as a replacement for liquid crystal displays.

However, absorption of water shortens a lifetime of the light emitting element. In order to avoid such absorption, a display having an organic electro luminescent device between a glass substrate and a sealing glass is surrounded by a sealant to seal the device. The sealant keeps the device from absorption of moisture contained in air.

Further, it is necessary to fill a working space where an EL display is manufactured with inert gas to avoid water absorption when manufacturing an organic EL display. Therefore, a working space under limited water content (under dew point control) where an EL device can be kept from water absorption is formed. Forming such a working space is shown in Japanese Patent Publication No. 2002-216958.

When sealing an EL device, a sealing glass is bonded with a glass substrate on which an EL device is set after applying a sealant on the sealing glass. It is not necessary to apply a sealant on the sealing glass under dew point control because an EL device is set not on the sealing glass but on the glass substrate. In other words, no applying apparatus applies a sealant under dew point control.

However, not having such an applying apparatus limits flexibility in optimizing a procedure for manufacturing an EL display.

Further, it is necessary for a working space of a bonding apparatus to control a dew point in order for an EL device not to be exposed in air when bonding the sealing glass with the glass substrate on which an EL device is set. Therefore, an anterior chamber to carry in the sealing glass is provided in order to form an "air lock" and maintain the working space under dew point control.

However, providing an anterior chamber causes a longer tact time and a lowered productivity, because it is necessary to fill the anterior chamber with inert gas every time the sealing glass is carried in. Consequently, shorting a tact time is desired.

SUMMARY

Consistent with the present invention, there is an apparatus to apply a material to an object provided. The apparatus comprises a first chamber having an ambient atmosphere of inert gas; a second chamber having an ambient atmosphere switchable between inert gas and air; and a channel connecting the first and second chambers. The apparatus also comprises a first door provided between the first and second chambers and operable between first and second positions; a second door provided on the second chamber providing access from outside the apparatus to the second chamber and operable between first and second positions; and a first holder in the first chamber comprising a structure for removeably holding an applicator. The apparatus further comprises a moveable table moveable through the second door and between the first and second chambers through the connecting channel; and a second holder mounted on the table and comprising a structure for removeably holding an applicator.

DETAILED DESCRIPTION

One embodiment consistent with the present invention is explained, with reference to FIG. 1 to FIG. 9.

Firstly, a structure of a display panel 410 on which plural electro luminescent (EL) devises are provided will be described.

Figure 1:
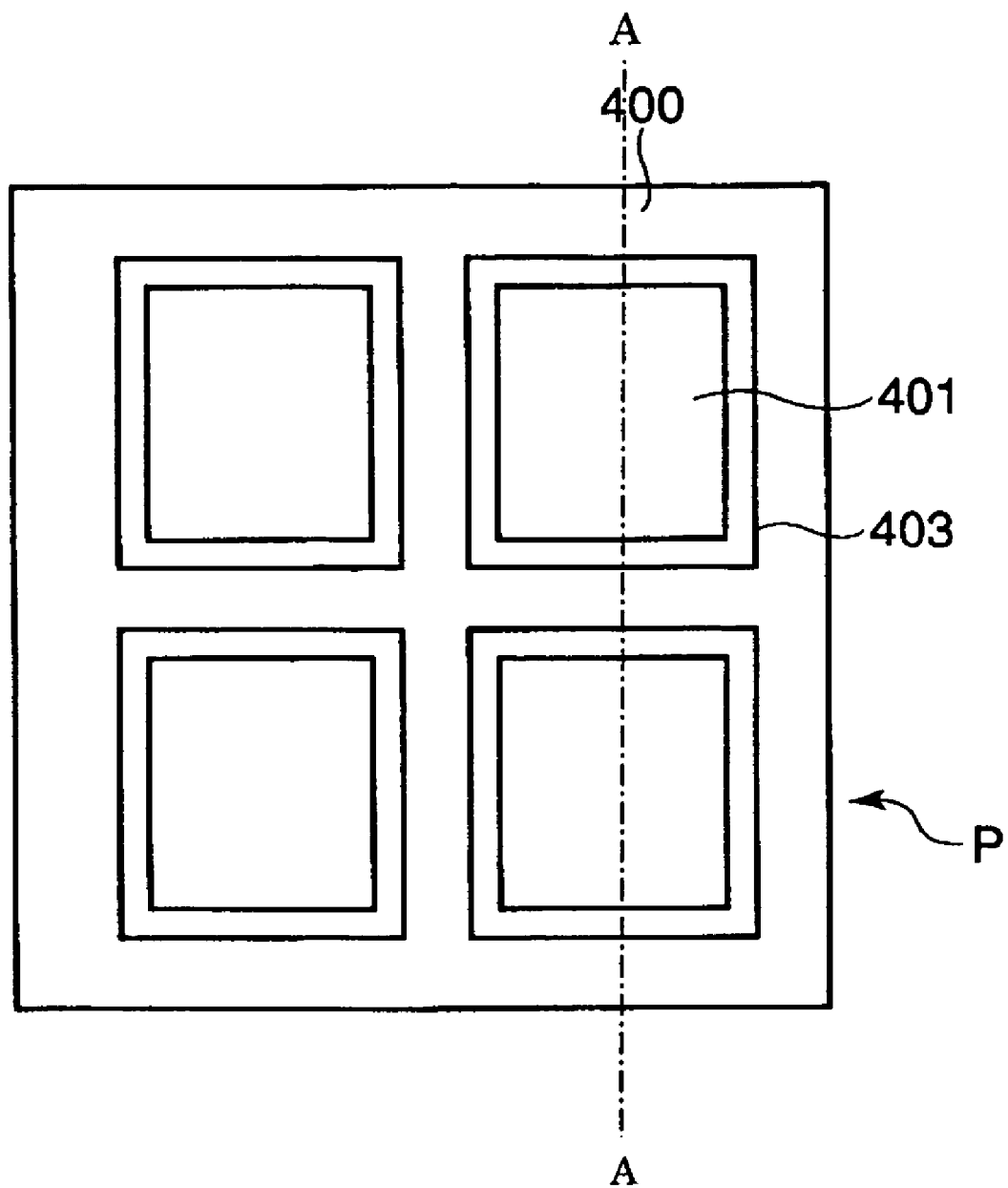
FIG. 1 is a plan view of a portion of a display panel.
Figure 2:
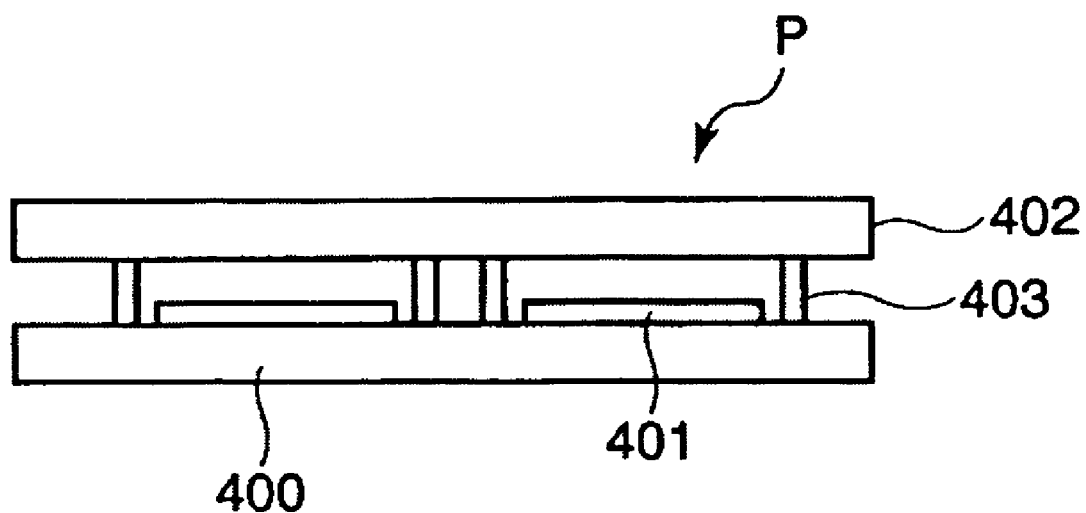
FIG. 2 is a vertical section of the display panel of FIG. 1.

FIG. 1 shows a horizontal section of a display panel 410. FIG. 2 shows a vertical section of display panel 410.

As shown in both FIGS. 1 and 2, display panel 410 is provided with a glass substrate 400 (a second substrate). A plurality of organic EL devices 401 (light emitting elements) are formed on glass substrate 400. As shown in FIG. 2, a substrate in the form of a sealing glass 402 is placed over EL devices 401 leaving a gap between substrate 400 and EL devices 401.

A sealant 403 (FIG. 2) surrounding each EL device 401 is applied between glass substrate 400 and sealing glass 402. Sealant 403 keeps EL device 401 from air. Sealant 403 also serves as an adhesive agent bonding between glass substrate 400 and sealing glass 402.

Figure 3:
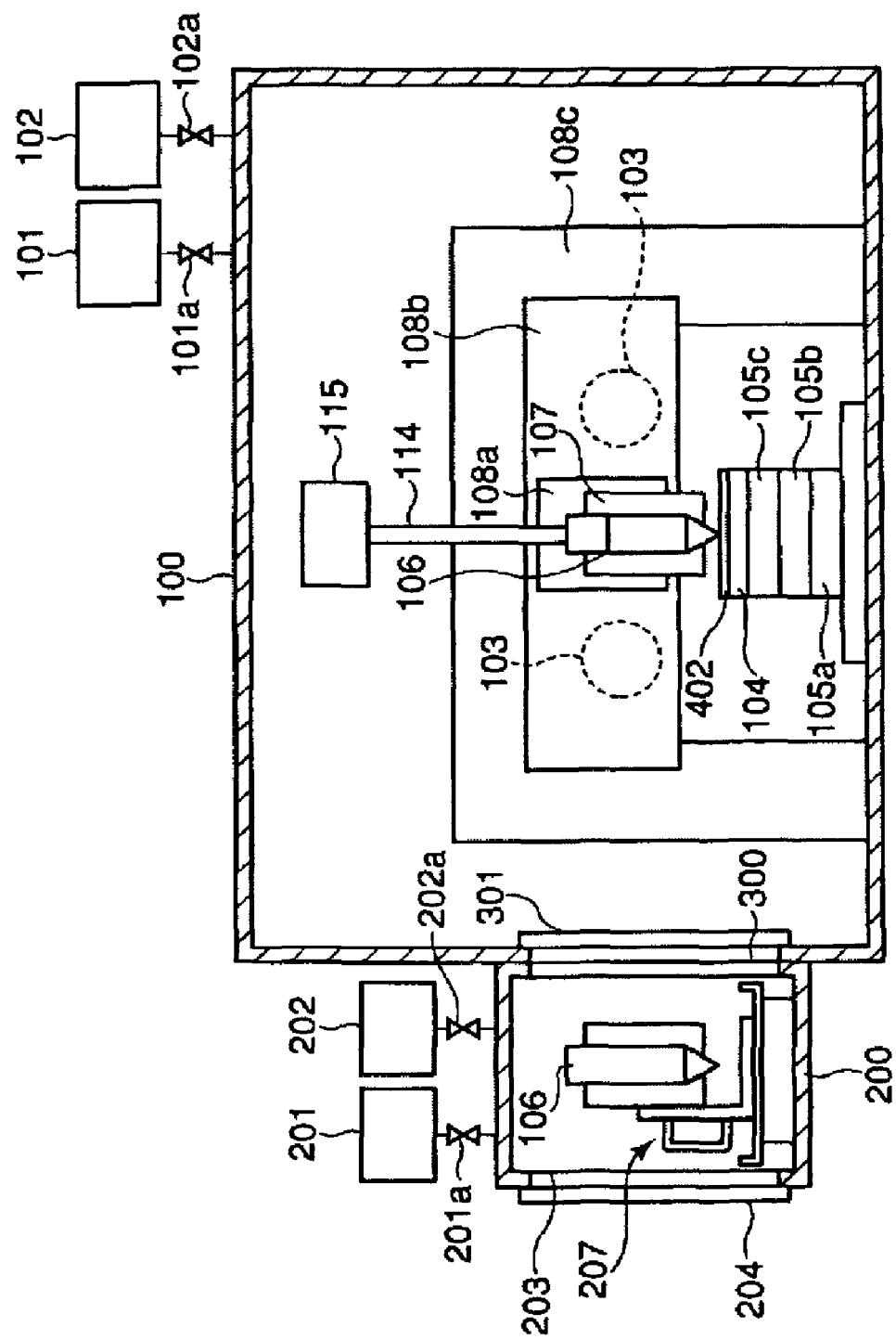
FIG. 3 is a schematic sectional diagram of a sealant applying apparatus, consistent with the invention.

Next, a sealant applying apparatus 10 will be explained with reference to FIG. 3. FIG. 3 is a schematic sectional diagram of sealant applying apparatus 10. Apparatus 10 is provided with a sealed chamber 100 (a first chamber) where an applying process is carried out and a sealed chamber 200 (a second chamber) where replacement of an applicator 106 is performed. Sealed chambers 100 and 200 neighbor each other. A connecting channel 300 connects between chambers 100 and 200.

A first door 301, operable between open and closed positions, is provided between chambers 100 and 200 so as to permit an object to be moved between chambers 100 and 200.

A first gas supply 101 is connected to chamber 100 so as to supply inert gas, such as nitrogen or argon to first chamber 100 via a first supply valve 101a. A first evacuator 102 is also connected to chamber 100 so as to evacuate gas therein via a first exhaust valve 102a. Opening both first supply valve 101a and exhaust valve 102a at the same time, fills chamber 100 with a single kind or several kinds of inert gasses. Several kinds of inert gasses may fill chamber 100 by controlling a valve.

Glove ports 103 (shown in dashed lines in FIG. 3) are formed in a wall of chamber 100. Glove ports 103 are made of a pair of resin gloves into which an operator inserts hands so as to operate a manual procedure without breaking the seal of chamber 100.

A table in the form of a stage 104 for holding sealing glass 402 is provided. Stage 104 is located inside chamber 100 in a substantial horizontal position. Stage 104 is supported by an X-table 105a, a Y-table 105b and a θ-table 105c from the bottom up.

Figure 4:
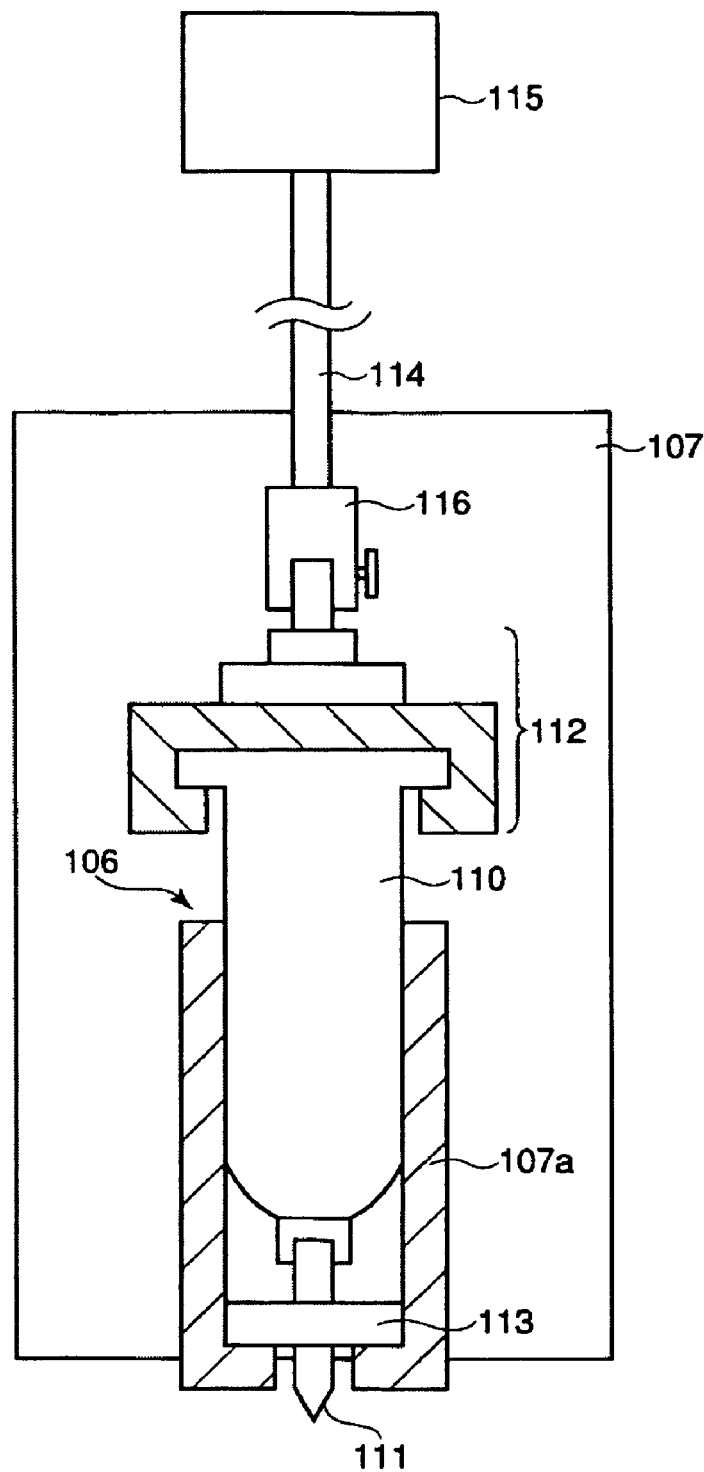
FIG. 4 shows a schematic structure of a applicator, consistent with the invention.

An applicator 106 for dispensing sealant is set above stage 104. FIG. 4 shows a schematic structure of applicator 106. Applicator 106 is detachably supported by a holding part 107a of a fixed holder 107 for holding a applicator.

Fixed holder 107 (FIG. 3) is supported by an X-table 108a, a Z-table 108b and a Y-table 108c. Tables 108a, 108b and 108c are movable in X, Y, and Z directions, respectively, to a relative position between applicator 106 and sealing glass 402.

As shown in FIG. 4, applicator 106 is provided with a removable syringe 110 to store a sealant and a nozzle part 111 connected to a lower part of syringe 110 to output the sealant in syringe 110. A clamp 112 supports an upper part of syringe 110 and serves as an adaptor. A circular disc forms a stopper 113 provided on a side face of nozzle part 111. When syringe 110 is inserted into holding part 107a, stopper 113 fits within an inner surface of holding part 107a so that applicator 106 can be detachably held by holder 107.

A gas supply 115 (FIG. 4) is connected to an upper part of clamp 112 via a supply-pipe 114 using a one-touch joint 116. Using one-touch joint 116, an operator can detach supply-pipe 114 from clamp 112 with only one hand.

As shown in FIG. 3, a second gas supply 201 is provided to supply inert gas such as nitrogen or argon gas for chamber 200. Gas supply 201 is connected to chamber 200 via a second supply valve 201a. A second evacuator 202 is also connected to chamber 200 so as to evacuate gas therein via a second exhaust valve 202a. Opening both second supply valve 201a and exhaust valve 202a at the same time fills chamber 200 with a single kind or several kinds of inert gasses.

An opening 203 to carry in and out an object outside apparatus 10, is provided on a side wall of chamber 200, which opening 203 faces connecting channel 300. A second door 204 operable between open and closed positions, permits insertion and removal of objects between second chamber 200 and the outside environment.

Figure 5:
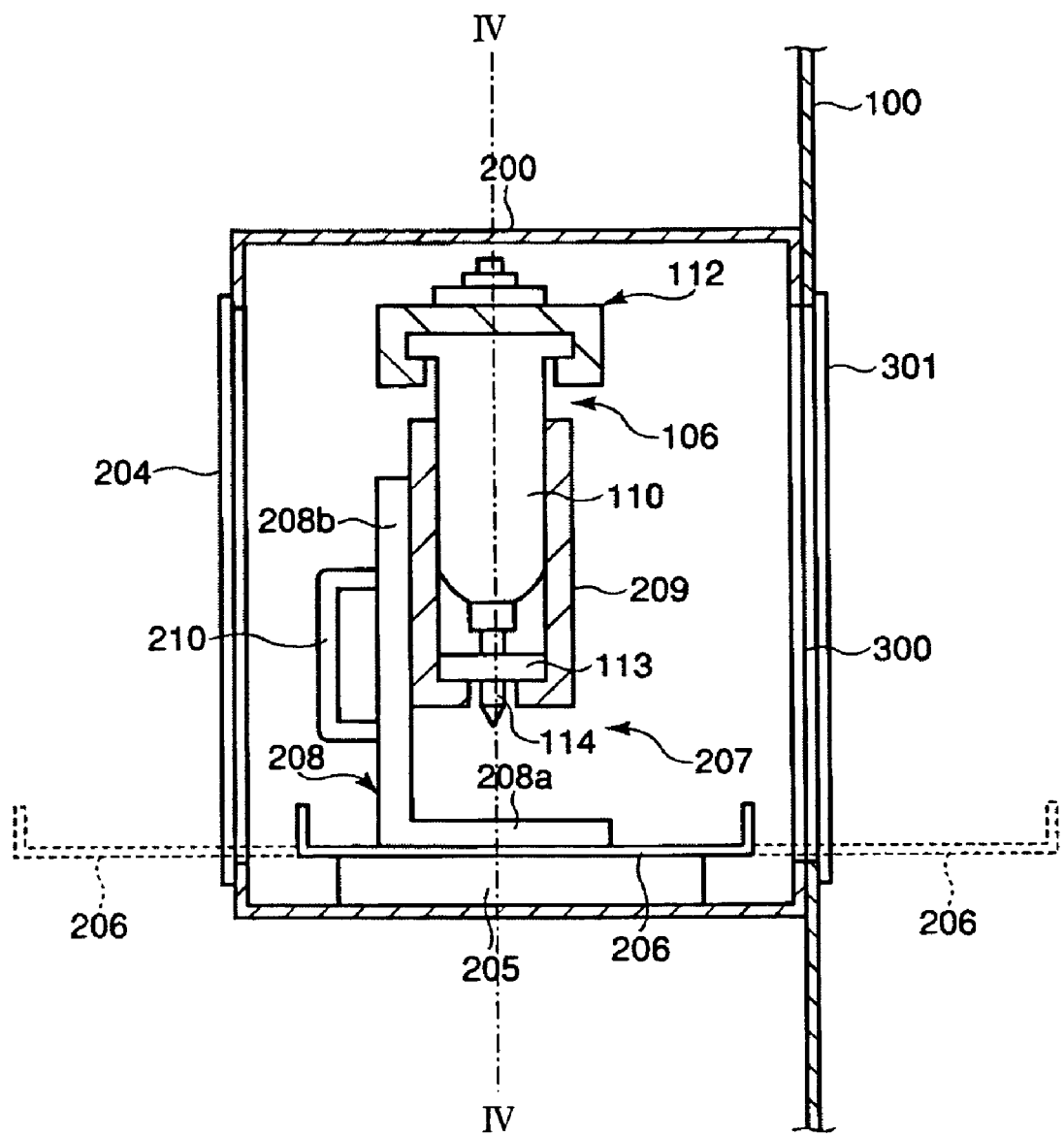
FIG. 5 is an enlarged vertical section of a chamber, consistent with the invention.

FIG. 5 is an enlarged vertical section of chamber 200. A tray driving apparatus 205 to drive a moveable tray 206 is placed inside chamber 200. A moveable holder 207 for holding a applicator is set on moveable tray 206.

Tray driving apparatus 205 is connected to a controller (not shown), which gives a command to tray driving apparatus 205 to move moveable tray 206 in a left-right direction as seen in FIG. 5. In this embodiment, forward motion (motion to the right) corresponds to a direction toward chamber 100, while a backward motion (motion to the left) corresponds to a direction toward chamber 200.

Moveable tray 206 is a tray having a long side in the left-right direction so that a front (right-hand) part of tray 206 extends into chamber 100, as shown in a dashed line in FIG. 5, when moveable tray 206 moves in the forward direction as much as possible, while a back (left-hand) part of tray 206 protrudes from chamber 200 when moveable tray 206 moves in the backward direction as much as possible.

Figure 6:
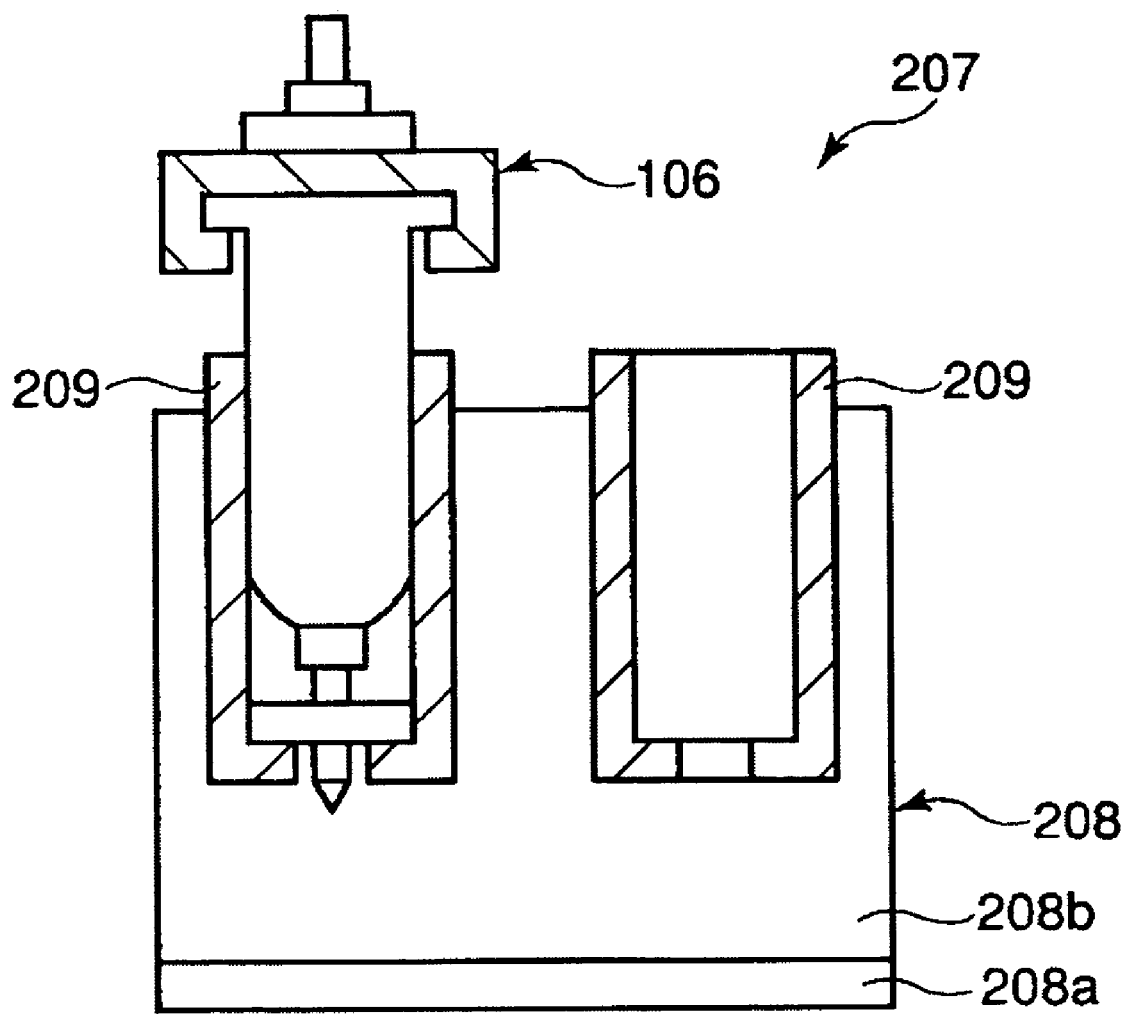
FIG. 6 is a front sectional view of a moveable holder, consistent with the invention.
Figure 7:
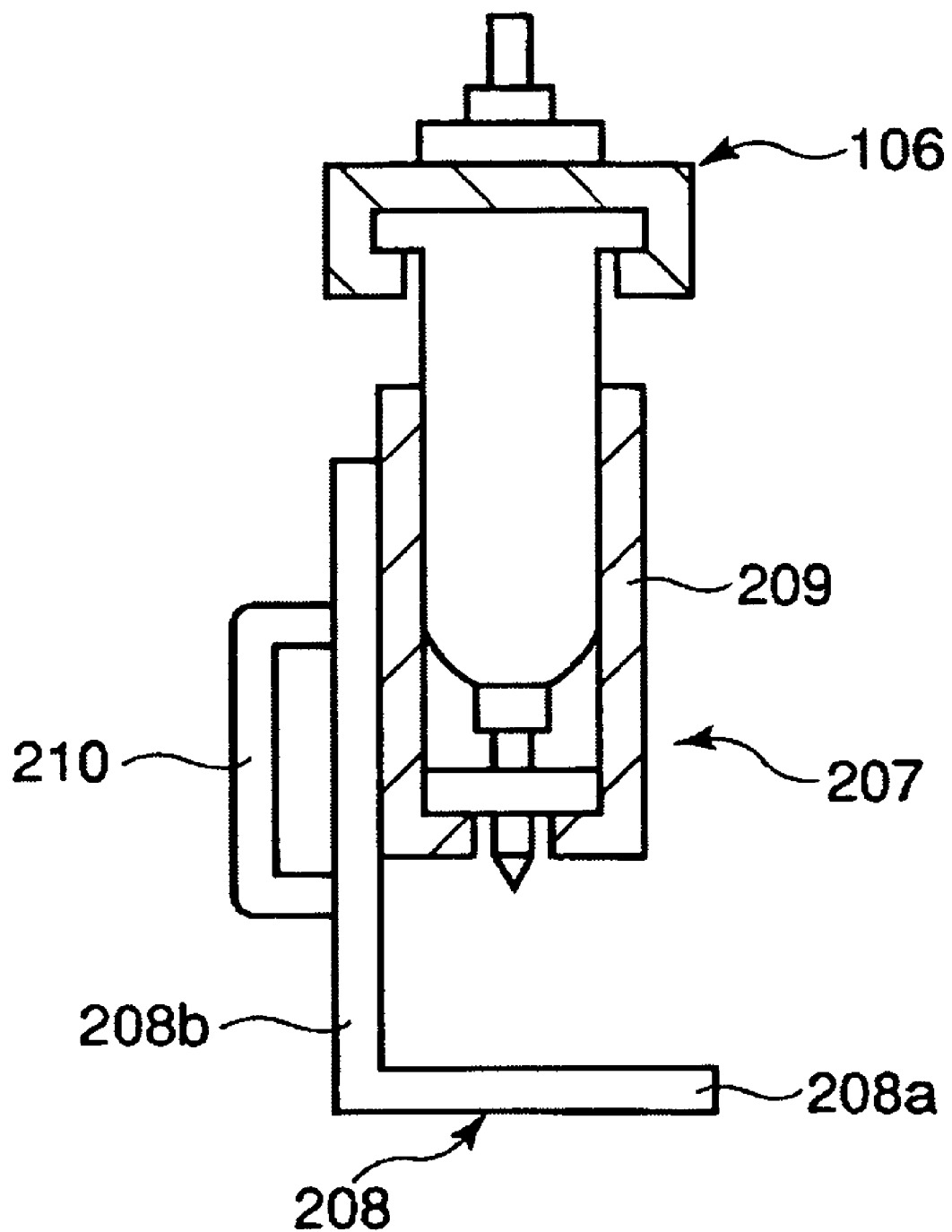
FIG. 7 is a side sectional view of the moveable holder of FIG. 6.
Figure 8:
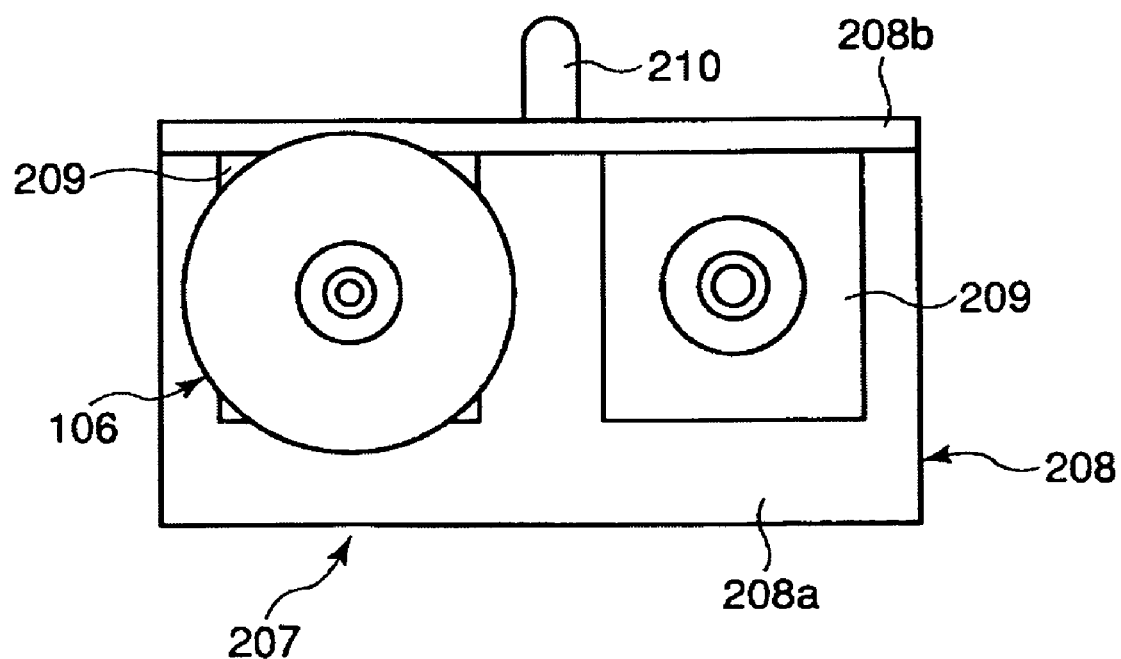
FIG. 8 is a plan view of the moveable holder of FIG. 6.

FIG. 6 is a front sectional view of moveable holder 207, taken along the line IV-IV of FIG. 5. FIG. 7 is a side sectional view of moveable holder 207. FIG. 8 is a plan view of moveable holder 207.

As shown in FIGS. 5, 6, and 7, moveable holder 207 has a supporting part 208 which comprises of a first plate 208a placed on moveable tray 206, and a second plate 208b extending perpendicular to moveable tray 206. A plurality of holding parts 209, e.g., two in this embodiment, are set in parallel on an inner wall of second plate 208b so as to hold two applicators.

Holding parts 209 have similar structure to that of holding part 107a (FIG. 4). One of holding parts 209 detachably holds a applicator 106 filled with a sealant.

In this embodiment, the number of holding parts 209 is two. However, one or more holding parts 209 can be provided. That is, if the number of support holders 107 to respectively hold applicator 106 is N, the number of holding parts 209 must be at least N+1. That is, holder 207 can hold more applicators 106 than the number of applicators held by holder 107, thus resulting that at least one holding part 209 of holder 207 holds no applicator 106.

As shown in FIG. 7, a C-shaped handle 210 is built on an outer wall of second plate 208b. Grabbing and moving handle 210 makes holder 207 move on moveable tray 206.

Referring to FIG. 5, if holder 207 is placed on the front-most part (farthest to the right) of moveable tray 206, driving moveable tray 206 in the forward direction transports applicator 106 (held by holder 207) into chamber 100. Similarly, if holder 207 is placed on the rear-most (farthest to the left) part of moveable tray 206, driving moveable tray 206 in the backward direction causes applicator 106 to be removed from apparatus 10. In other words, moveable tray 206 moves applicator 106 between chambers 100 and 200.

Operation of sealant applying apparatus 10 is explained next, referring to FIG. 3. Firstly, first gas supply valve 101a and gas exhaust valve 102a are opened to fill chamber 100 with inert gas such as Nitrogen gas or Argon gas. When the dew point of the inert gas in chamber 100 becomes −40 centigrade, a gas supply 115 applies pressure to sealant in syringe 110 of applicator 106 so as to apply the sealant to sealing glass 402.

In applying sealant, stage 104 is moved against with respect to applicator 106 while maintaining a predetermined distance between applicator 106 and sealing glass 402. In this manner, the applied sealant surrounds each EL device 401 when sealing glass 402 is bonded with glass substrate 400.

Figure 9:
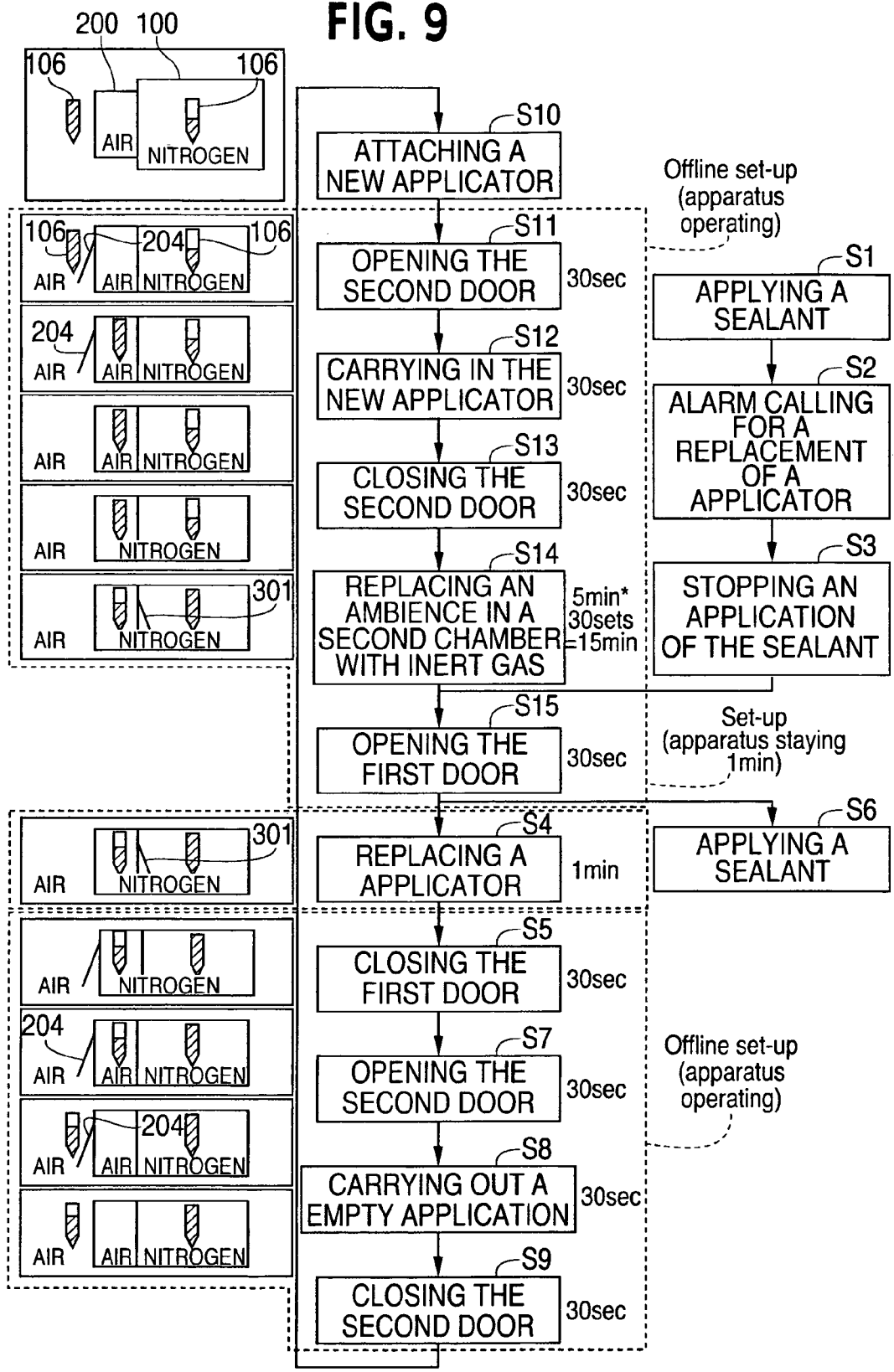
FIG. 9 is a flow chart showing a procedure of a replacement of applicator, consistent with the invention.

When running short of a sealant in syringe 110, applicator 106 is replaced. FIG. 9 is a flow chart showing a procedure of the replacement.

In a step S1, a sealant is applied. When the supply of applicator 106 falls close to empty, an alarm sounds in step S2, for replacement of empty applicator 106. Applications of sealant is stopped at by operation of tables 105a, 105b, and 105c, at step S3. Replacement of applicator 106 is carried out in step S4.

In a first stage of step S4, chamber 100 is filled with inert gas such as nitrogen or argon gas, similar to chamber 200. First door 301 (FIG. 5) is then opened. Next, tray driving apparatus 205 drives moveable tray 206 so that a replacement applicator 106 is transferred from chamber 200 to chamber 100.

After holder 207 and applicator 106 are completely inserted into chamber 100 by moveable tray 206, an operator manually removes empty applicator 106 from fixed holder 107 through glove port 103 (FIG. 3). The operator then sets the removed empty applicator 106 in unoccupied holding part 209 of moveable holder 207.

Then, the operator detaches replacement applicator 106 filled with sealant, from the other holding part 209 of moveable holder 207. The operator attaches replacement applicator 106 to holding part 107a of fixed holder 107 in chamber 100.

After attaching replacement applicator 106 to holding part 107a, moveable tray 206 is driven in the backward direction so as to remove moveable holder 207 from chamber 100.

After moveable holder 207 and empty applicator 106 hold therein are completely removed from chamber 100, first door 301 is closed in a step S5. Then, a sealant is applied again to sealing glass 402, from replacement applicator 106 in a step S6.

When first door 301 is perfectly closed, second gas supply valve 201a and gas exhaust valve 202a are opened so as to fill second chamber 200 with air. After confirming that the chamber 200 is essentially filled with air, second door 204 is opened in a step S7. Then, tray driving apparatus 205 (FIG. 5) moves moveable tray 206 so as to transfer empty applicator 106 and moveable holder 207 from chamber 200 to the outside of sealant applying apparatus 10.

When empty applicator 106 is completely removed, second door 204 is closed in a step S9. Empty applicator 106 is removed from holding part 209 of moving holder 207, and replaced with a new applicator 106, filled with sealant in a step S10.

Second door 204 is opened after setting new applicator 106 in holding part 209 in a step S11. Tray driving apparatus 205 drives moveable tray 206 so as to carry in new applicator 106 along with holding part 209 into chamber 200 in a step S12.

When moveable holder 207 and new applicator 106 held thereby are completely transferred into chamber 200, second door 204 is closed in a step S13. Then, chamber 200 is filled with inert gas by opening second gas supply valve 201a and second exhaust valve 202a in a step S14. In this embodiment, a 15-minute process to fill chamber 200 with inert gas is carried out in three stages (each stage has 5 minutes).

When it is confirmed that the dew point of the gas inside chamber 200 becomes −40 centigrade, first door 301 is opened and an operator, through glove port 103, manually moves new applicator 106 with moveable holder 207 to a front part of moveable tray 206 in a step S15. Then, a sealant in applicator 106 in chamber 100 is applied until applicator 106 inside chamber 100 becomes empty.

In this embodiment, a replacement of applicator 106 for moveable holder 207 (replacing the ambience in second chamber 200 with air to remove applicator 106 and replacing the ambience in second chamber 200 with inert gas) is concurrently carried out while a sealant is applied to sealing glass 402 in chamber 100. Sealant applying apparatus 10 makes it possible to acquire both a first space where sealant is applied to sealing glass 402 and a second space, which can be apart from the first space, where a new applicator 106 filled with sealant is supplied by using two sealed chambers 100 and 200.

Thus, chamber 100 can be always keep in dry inert gas atmosphere. Consequently, a desiccant provided on sealing glass 402 is prevented from absorbing moisture contained in air during the manufacturing process. Further, it is also possible to directly apply a sealant to glass substrate 400 on which organic EL devices 401 are formed, because organic EL devices 401 are prevented from absorbing moisture contained in air, thereby preventing moisture-induced deterioration of organic EL devices 401.

Moreover, application of sealant to sealing glass 402 in chamber 100 may continue during replacement of empty applicator 106 during ambient atmosphere with new applicator 106, and during exchange of the ambient atmosphere in chamber 200.

Therefore, applications of sealant need be stopped only while an operator manually detaches empty applicator 106 from holding part 107a of fixed holder 107, and attaches new applicator 106 filled with sealant.

Consequently, time required for the sealing operation is reduced and productivity is improved, since it is not necessary to stop applying sealant during both a replacement of applicator 106 against moveable holder 207 and an exchange of the ambience in chamber 200, which exchange normally takes a long time.

In FIG. 9, the time necessary to carry out various stages of the process is shown, in seconds, by the numbers shown on the right of each stage. The amount of time to exchange applicator 106 is shortened to only 1 minute, which had been 20 minutes if a process of applying a sealant to sealing glass 402 and a process of replacing applicator 106 are not concurrently carried out.

In this embodiment, single moveable holder 207 having two holding parts 209 is used. Thus, moveable holder 207 can hold empty applicator 106 which is detached from fixed holder 107 when new applicator 106 held by moveable holder 207 is attached to fixed holder 107. Namely, the replacement of applicator 106 is completed in one time so that productivity improves.

Further, when holder 207 is placed at the front-most part of moveable tray 206, driving moveable tray 206 in the forward direction causes replacement of applicator 106, held in holder 207, to enter chamber 100. Correspondingly, if holder 207 is placed on the rear-most part of moveable tray 206, driving moveable tray 206 in the backward direction causes empty applicator 106 to be brought out from apparatus 10.

Thus, applicators 106 can be removed from moveable holder 207 merely by pulling up applicator 106 in a vertical direction. As a result, applicator 106 is easily detached from moveable holder 207, which may further improve productivity. Moreover, dropping applicator 106 by accident hardly happens.

Gas supply 115 is connected to an upper part of clamp 112 via a supply-pipe 114 using an one-touch joint 116. Thus, each hand of an operator can perform different steps, e.g., grabbing moveable holder 207 with one hand while detaching or attaching applicator 106 with the other hand. As a result, working efficiency improves.

Figure 10:
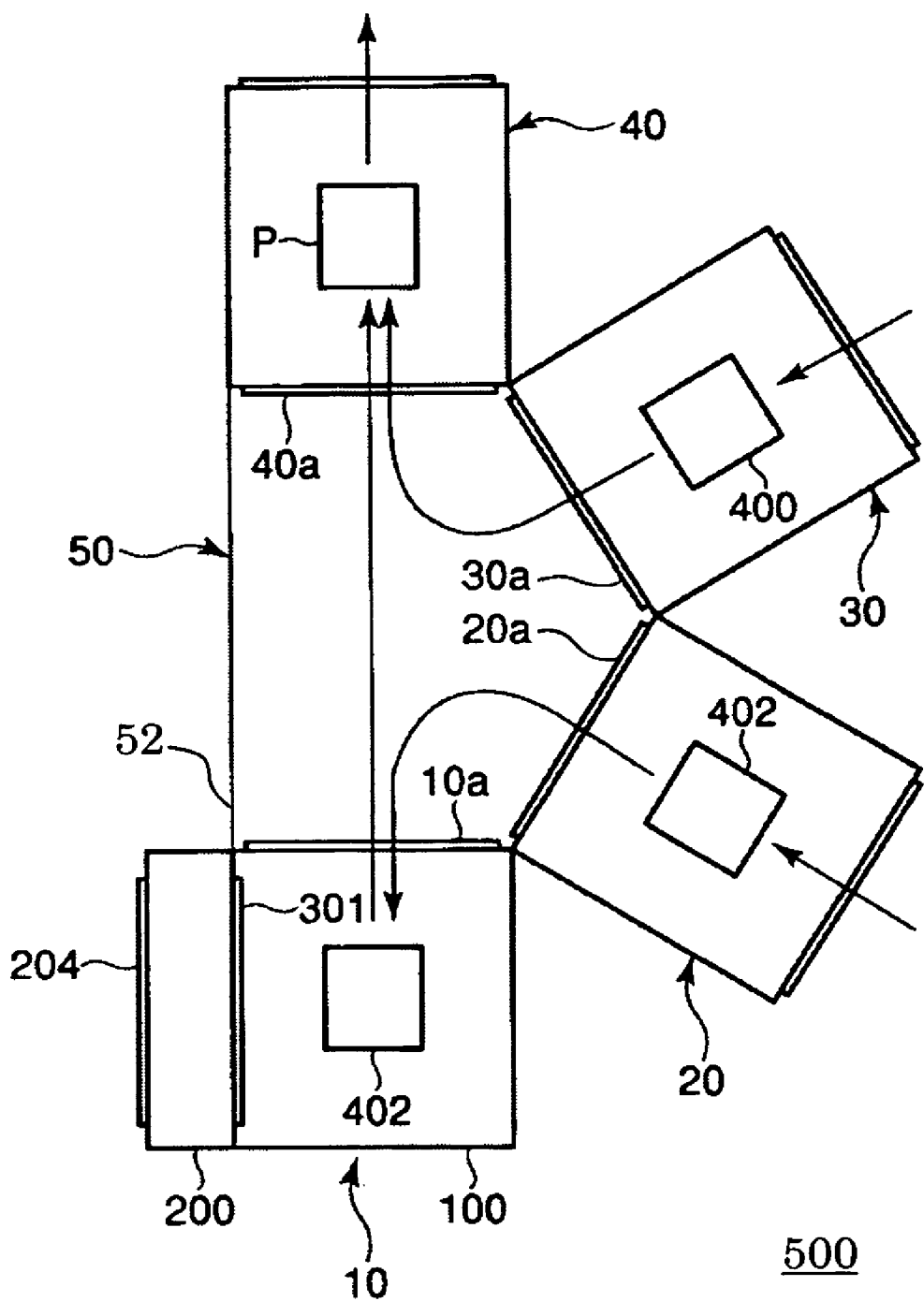
FIG. 10 is a schematic diagram of an organic EL display manufacturing apparatus, consistent with the invention.

A second embodiment, consistent with the present invention, is explained next with reference to FIG. 10. FIG. 10 is a schematic diagram of an organic EL display manufacturing machine.

As shown in FIG. 10, organic EL display manufacturing apparatus 500 (a display manufacturing apparatus) is provided with sealant applying apparatus 10, a sealing glass installation room 20 to install a sealing glass 402, a glass substrate installation room 30 to install a glass substrate 400 and a bonding apparatus 40 to bond between glass substrate 400 and sealing glass 402.

A connecting room 50 including a wall 52 respectively connects to sealant applying apparatus 10, sealing glass installation room 20, glass substrate installation room 30 and bonding apparatus 40 via doors 10a, 20a, 30a and 40a, each operable between open and closed positions. The ambient atmosphere in connecting room 50 is always maintained as 100% inert gas.

Sealing glass installation room 20 serves as an anterior chamber so as not to dilute or contaminate an inert atmosphere in connecting room 50. Ambient atmosphere in glass installation room 20 can be alternated between air and inert gas.

Glass substrate installation room 30 serves as an anterior chamber so as not to break an inert atmosphere in connecting room 50. Ambient atmosphere in glass substrate installation room 30 can be also alternated between air and inert gas.

Organic EL devices 401 are mounted on glass substrate 400 in glass substrate installation room 30. Apparatus 10 then applies sealant to sealing glass 402. Bonding apparatus 40 then bonds sealing glass 402 (and applied sealant) to substrate 400, which contains mounted devices 401. Ambient atmosphere in bonding apparatus 40 can be also alternated between air and inert gas.

An operation of organic EL display manufacturing machine 500 is explained next. Firstly, sealing glass 402, which has been in glass installation room 20 is carried through connecting room 50 to sealant applying apparatus 10 and inserted into chamber 100 (FIG. 3). Apparatus 10 applies sealant to sealing glass 402 in chamber 100. Sealing glass 402, with applied sealant, is transferred to bonding apparatus 40 via connecting room 50.

Meanwhile, glass substrate 400, on which EL devices 401 have been mounted in advance, is carried from glass substrate installation room 30 into bonding apparatus 40 via connecting room 50.

Sealing glass 402 is bonded to glass substrate 400 by bonding apparatus 40 so as to face each other. As a result, an organic EL panel P, comprising sealing glass 402 and glass substrate 400, is carried out from organic EL display manufacturing apparatus 500.

In this embodiment, organic EL display manufacturing apparatus 500 employs sealant applying apparatus 10 which improves working efficiency in applying sealant. As a result, a time to manufacture organic EL panel P is also shortened so that productivity of panel P improves.

Numerous modifications of the present invention are possible in light of the above teachings. It is therefore to be understood that, within the scope of the appended claims, the present invention can be practiced in a manner other than as specifically described herein. When a certain effect can be accomplished without some elements shown in this embodiment, such elements can be omitted.

For instance, it is possible to connect chambers 100 and 200 using a pipe having an opening/closing valve instead of providing gas supply 201 to fill chamber 200 with inert gas, since inert gas can be flowed to chamber 200 by opening the valve.

In this embodiment, an organic EL display is exemplified as a light emitting element. However other light emitting elements whose properties may be changed according to an ambience can be used.

What is claimed is:

1. An apparatus for applying a material to an object, comprising:
    a first chamber having an ambient atmosphere of inert gas;
    a second chamber having an ambient atmosphere switchable between inert gas and air;
    a connecting channel connecting the first and second chambers;
    a first door provided between the first and second chambers and operable between first and second positions;
    a second door provided on the second chamber providing access from outside the apparatus to the second chamber and operable between first and second positions;
    a first holder in the first chamber comprising a structure for removeably holding an applicator;
    a moveable table moveable through the second door and between the first and second chambers through the connecting channel;
    a moveable table driving apparatus inside the second chamber for moving the moveable table; and
    a second holder mounted on the moveable table and comprising a structure for removeably holding an applicator.

2. An apparatus according to claim 1, wherein the applicator comprises a syringe to contain the material.

3. An apparatus according to claim 1, comprising a glove port in the first chamber to provide operator access to the first and second holders while maintaining the inert gas ambient atmosphere.

4. An apparatus according to claim 1, wherein:
    the moveable table is configured to move the applicator which ends the application of the material and held by the second holder from the second chamber to the outside of the apparatus through the second door; and
    the moveable table is also configured to move the applicator which is filled with the material and held by the second holder from the outside of the apparatus to the second chamber through the second door.

5. An apparatus according to claim 1, wherein the second holder comprises a structure for removeably holding a greater number of applicators than are held by the first holder.

6. An apparatus according to claim 5, wherein the first holder comprises a structure for removeably holding a plurality of applicators.

7. An apparatus according to claim 1, further comprising: a first supply coupler for coupling a gas supply to the first chamber,
    a first evacuator coupler for coupling a gas evacuator to the first chamber,
    a second supply coupler for coupling a gas supply to the second chamber; and
    a second evacuator coupler for coupling a gas evacuator to the second chamber.

8. An apparatus according to claim 1, comprising a plurality of applicators removeably held by the first and second holders.

9. An apparatus according to claim 8, wherein the applicator comprises a nozzle applying a sealant to a substrate.

10. An apparatus according to claim 1, wherein the second holder comprises a structure for removeably holding a plurality of applicators.

11. An apparatus according to claim 1, further comprising:
    a third door provided between the first chamber and the outside of the apparatus to a room.

12. A display manufacturing apparatus, comprising:
    an apparatus for applying a sealant to a first substrate, which apparatus comprises:
        a first chamber whose ambience can be kept in inert gas;
        a second chamber whose ambience can be replaced between inert gas and air;
        a connecting channel connected between the first and second chambers;
        a first openable and closable door provided between the first and second chambers a second openable and closable door provided on the second chamber to let in and out an applicator for applying the sealant to the first substrate;

a first holder in the first chamber to detachably hold the applicator;

a second holder in the second chamber to detachably hold the applicator;

a moveable table for moving the applicator which is filled with the sealant and held by the second holder, from the second chamber to the first chamber through the connecting channel, the moveable table for moving the applicator which ends the application of the sealant from the first chamber to the second chamber through the connecting channel; and a moveable table driving apparatus inside the second chamber for moving the moveable table; and a bonding apparatus to bond the first substrate on which the sealant is applied with a second substrate on which an electro luminescent device is formed.

13. A display manufacturing apparatus according to claim 12, further comprising:

a third door provided between the first chamber and an outside of the apparatus to a room.

* * * * *